(12) United States Patent
Schaefer

(10) Patent No.: US 12,140,631 B2
(45) Date of Patent: Nov. 12, 2024

(54) MEASUREMENT SYSTEM FOR IDENTIFYING AGGRESSOR SIGNALS

(71) Applicant: Rohde & Schwarz GmbH & Co. KG, Munich (DE)

(72) Inventor: Andrew Schaefer, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 10 days.

(21) Appl. No.: 17/554,410

(22) Filed: Dec. 17, 2021

(65) Prior Publication Data

US 2022/0236326 A1 Jul. 28, 2022

(30) Foreign Application Priority Data

Jan. 22, 2021 (EP) ..................... 21153097

(51) Int. Cl.
*G01R 31/319* (2006.01)
*G06N 3/02* (2006.01)

(52) U.S. Cl.
CPC . *G01R 31/31905* (2013.01); *G01R 31/31908* (2013.01); *G06N 3/02* (2013.01)

(58) Field of Classification Search
CPC ............ G01R 13/029; G01R 31/31905; G01R 31/31908; G01R 31/31932; G01R 33/54;
(Continued)

(56) References Cited

U.S. PATENT DOCUMENTS 6,148,420 A * 11/2000 Schlater ............. G01R 31/3177
714/39
6,703,825 B1 * 3/2004 Creek ............ G01R 31/318544
324/756.05

(Continued)

FOREIGN PATENT DOCUMENTS

| CN | 110275054 A | 9/2019 |
|----|-------------|--------|
| CN | 111474408 A | 7/2020 |
| KR | 20130114691 | * 10/2013 |

OTHER PUBLICATIONS

Baev, A.B. et al., "Cyclostationary Evaluation of Voltage Crosstalk Between PCB's Transmission Lines," 2020 Systems of Signals Generating and Processing on the Field of On Board Communications, IEEE, Mar. 19, 2020, 6 pages.

(Continued)

*Primary Examiner* — Vinh P Nguyen
(74) *Attorney, Agent, or Firm* — CHRISTENSEN O'CONNOR JOHNSON KINDNESS PLLC

(57) ABSTRACT

A measurement instrument for testing a device under test is described. The device under test has at least two test points. The measurement instrument includes a first measurement channel, a second measurement channel, and a machine-learning circuit. The first measurement channel is configured to process a first input signal associated with one of the at least two test points, thereby generating a first measurement signal. The second measurement channel is configured to process a second input signal associated with another one of the at least two test points, thereby generating a second measurement signal. The machine-learning circuit is configured to determine at least one correlation quantity based on the first measurement signal and based on the second measurement signal, wherein the at least one correlation quantity is indicative of a correlation between the first measurement signal and the second measurement signal. Further, a measurement system and a signal processing method are described.

11 Claims, 4 Drawing Sheets

(58) Field of Classification Search
CPC .............. G01R 1/0408; G01R 13/0272; G01R 31/2891; G01R 31/2832; G01R 21/00; G06N 3/02; G06N 3/029; G06F 18/217; G06F 17/18; G06F 11/3409; G06F 21/554; G06F 21/566; G06F 2221/033

See application file for complete search history.

(56) References Cited

U.S. PATENT DOCUMENTS

| | | | | |
|---|---|---|---|---|
| 7,352,167 | B2* | 4/2008 | Sullivan | G01R 13/0254 702/68 |
| 8,674,713 | B2* | 3/2014 | Miyazaki | G01R 13/029 324/750.01 |
| 9,759,747 | B2* | 9/2017 | Schaefer | G01R 13/0263 |
| 9,958,479 | B2* | 5/2018 | Schaefer | G01R 13/02 |
| 10,121,104 | B1* | 11/2018 | Hu | G06N 3/045 |
| 10,425,125 | B2* | 9/2019 | Schaefer | H04B 3/46 |
| 10,527,650 | B2* | 1/2020 | Montijo | G01R 13/0254 |
| 11,293,982 | B2* | 4/2022 | Diegmann | G01R 31/31908 |
| 2016/0131699 | A1 | 5/2016 | Hamilton | |
| 2019/0285666 | A1 | 9/2019 | Peeters Weem | |
| 2020/0152295 | A1* | 5/2020 | Gibson | G16C 20/40 |
| 2020/0210823 | A1 | 7/2020 | Schaefer | |
| 2021/0052206 | A1* | 2/2021 | Kale | G06V 10/82 |
| 2022/0390513 | A1* | 12/2022 | Hazzard | G01R 31/31723 |

OTHER PUBLICATIONS

Deng, Li, "A tutorial survey of architectures, algorithms, and applications for deep learning," Journals APSIPA Transactions on Signal and Information Processing; vol. 3; Jan. 1, 2014, 29 pages.

Kwon, D. et al., "Improving Non-Profiled Side-Channel Attacks using Autoencoder based Preprocessing," IACR, International Association for Cryptologic Research; 20200409:124819; 26 pages.

* cited by examiner

MEASUREMENT SYSTEM FOR IDENTIFYING AGGRESSOR SIGNALS

FIELD OF THE DISCLOSURE

Embodiments of the present disclosure generally relate to measurement instruments for testing a device under test. Embodiments of the present disclosure further relate to signal processing methods for testing a device under test.

BACKGROUND

In some cases, a particular signal of an electronic system may be failing to fulfill its requirements some or all of the time. There can be several reasons for this failure, e.g., an inappropriate board design or suboptimal settings concerning the signal itself.

Another reason for such a failure can be influences from other signals within the electronic system. In this case, the user of the electronic system has to determine which signal is causing the problems in the signal under observation. The terminology 'find the aggressor' is often used to describe this type of debugging problem.

Typically, sets of signals are observed for long periods of time in order to observe any relationships between the signal under observation and any potential aggressor signals. If the relationships are not obvious, e.g., some kind of linear coupling, finding the aggressor can be a time consuming task.

Thus, there is a need for a measurement instrument, a measurement system, and a signal processing method that allow for an easier identification of aggressor signals.

SUMMARY

Embodiments of the present disclosure provide measurement instruments that are used for testing a device under test that has at least two test points. In an embodiment, a measurement instrument comprises a first measurement channel, a second measurement channel, and a machine-learning circuit. The first measurement channel is configured to process a first input signal associated with one of the at least two test points, thereby generating a first measurement signal. The second measurement channel is configured to process a second input signal associated with another one of the at least two test points, thereby generating a second measurement signal. The machine-learning circuit is configured to determine at least one correlation quantity based on the first measurement signal and based on the second measurement signal, wherein the at least one correlation quantity is indicative of a correlation between the first measurement signal and the second measurement signal.

The present disclosure is based on the idea to analyze correlations between the first measurement signal and the second measurement signal by the machine-learning circuit using a suitable machine-learning technique.

For example, the machine-learning circuit is trained to determine the at least one correlation quantity based on the first management signal and based on the second measurement signal in a fully automatic manner.

If there is a certain amount of correlation between the measurement signals, this is a strong indicator that an electronic component of the device under test generating the first input signal may be influencing an electronic component of the device under test generating the second input signal or vice versa.

Accordingly, the at least one determined correlation quantity can be used for identifying aggressor signals within the device under test.

In some embodiments, the machine-learning circuit may, for example, be configured to automatically determine if at least one of the first input signal and the second input signal is an aggressor signal (i.e., unwantedly influences the other input signal) based on the at least one correlation quantity determined.

Alternatively or additionally, the at least one correlation quantity may, for example, be displayed to a user, such that the user of the measurement instrument may decide whether one of the input signals is an aggressor signal based on the at least one correlation quantity determined.

Even if the final conclusion about the aggressor signal is not performed by the machine-learning circuit, the at least one determined correlation quantity is easier to handle for the user than a bulk of data comprising a long-term observation of the first input signal and of the second input signal. Accordingly, the measurement instrument according to embodiments of the present disclosure is easier to handle for a user.

Moreover, the at least one correlation quantity may, for example, be determined fully automatically, such that the needed time for identifying aggressor signals is significantly reduced.

According to an aspect of the present disclosure, the machine-learning circuit may, for example, comprise an artificial neural network. The artificial neural network is trained to determine the at least one correlation quantity based on the first measurement signal and based on the second management signal. The first measurement signal and/or the second measurement signal are input quantities of the artificial neural network. The at least one correlation quantity is an output quantity of the artificial neural network.

According to a further aspect of the present disclosure, the artificial neural network may, for example, comprise an autoencoder. The first measurement signal and/or the second measurement signal are input quantities of the autoencoder. The at least one correlation quantity is an output quantity of the autoencoder.

The autoencoder may be trained to extract the most relevant information from the first measurement signal and/or from the second measurement signal, and to determine the at least one correlation quantity based on the information extracted.

In an embodiment of the present disclosure, the machine-learning circuit is configured to try to reconstruct the second measurement signal based on the first measurement signal in order to determine the at least one correlation quantity. In other words, the machine-learning circuit is trained to reconstruct the second measurement signal based on the first measurement signal (or vice versa). If the machine-learning circuit succeeds in reconstructing the second measurement signal (at least partially) based on the first measurement signal, this is a strong indicator for a correlation between the measurement signals, and thus between the input signals. Accordingly, in this case it can be concluded that the first input signal is an aggressor signal with respect to the second input signal.

According to another aspect of the present disclosure, the at least one correlation quantity may, for example, comprise a reconstruction function, wherein the reconstruction function describes a dependency of the second measurement signal on the first measurement signal. In other words, the machine-learning circuit tries to find a reconstruction function $S_2(x) = f(S_1(x))$ that describes the second measurement signal $S_2(x)$ in dependence of the first measurement signal $S_1(x)$, wherein x represents a time variable and/or a frequency variable. If such a function $f$ can be found, this is a strong indicator for a correlation between the measurement signals, and thus between the input signals. Accordingly, in this case it can be concluded that the first input signal is an aggressor signal with respect to the second input signal.

The reconstruction function $f$ may be a non-linear function. Accordingly, non-linear correlations between the input signals can be identified. Thus, using a machine-learning circuit in order to determine the at least one correlation quantity has the additional advantage that non-linear correlations can be identified.

In some embodiments, the machine-learning circuit may be trained to find a (non-linear) reconstruction function $S_2(x)=f(S_{1,i}(x), S_{2,i}(x))$ that describes the second measurement signal $S_2(x)$ in dependence of an ideal first measurement signal $S_{1,i}(x)$ and in dependence of an ideal second measurement signal $S_{2,i}(x)$, i.e., based on measurement signals without any perturbation due to aggressor signals. If such a reconstruction function $f$ can be found (and the dependence on $S_{2,i}(x)$ is non-trivial) this is a strong indicator for a correlation between the measurement signals, and thus between the input signals. Accordingly, in this case it can be concluded that the first input signal is an aggressor signal with respect to the second input signal.

The ideal measurement signals $S_{1,i}(x)$ may be obtained by measuring the first input signal while the electronic component of the device under test generating the second input signal is turned off. Likewise, the ideal measurement signal $S_{2,i}(x)$ may be obtained by measuring the second input signal while the electronic component of the device under test generating the first input signal is turned off.

In a further embodiment of the present disclosure, the first measurement channel is configured to pre-process the first input signal such that the first measurement signal comprises statistical information regarding the first input signal.

Alternatively or additionally, the second measurement channel may be configured to pre-process the second input signal such that the second measurement signal comprises statistical information regarding the second input signal.

The statistical information may, for example, comprise a pulse-width-histogram of any one of the input signals, a signal-to-noise ratio of any of the input signals, an/or an average power of any of the input signals.

Accordingly, additional information on the first input signal and/or the second input signal is provided, which can be used by the machine-learning circuit in order to determine the at least one correlation quantity.

In some embodiments, the machine-learning circuit is configured to determine the at least one correlation quantity based on the statistical information. This way, the accuracy of the at least one correlation parameter determined may be enhanced.

According to an aspect of the present disclosure, the measurement instrument may, for example, be configured to process at least one further input signal, thereby generating at least one further measurement signal, wherein the machine-learning circuit is configured to determine the at least one correlation quantity based on the at least one further measurement signal, and wherein the at least one correlation quantity is indicative of a correlation between the at least one further measurement signal and at least one of the first measurement signal and the second measurement signal. Accordingly, the machine-learning circuit may be trained to determine whether there is a significant correlation between two or more of first input signal, the second input signal, and the at least one further input signal.

In some embodiments, the machine-learning circuit may, for example, be configured to determine the at least one correlation quantity for all possible pairs of measurement signals, such that a separate correlation quantity is obtained for all possible pairs of input signals. Thus, the influence of each input signal on all other input signals is checked.

Alternatively or additionally, the machine-learning circuit may, for example, be configured to determine the at least one correlation quantity for groups of measurement signals, such that the at least one correlation quantity is indicative of a correlation between different groups of input signals.

The at least one further input signal may, for example, be processed by the first measurement channel, by the second measurement channel, and/or by a further measurement channel of the measurement instrument.

In a further embodiment of the present disclosure, the machine-learning circuit is configured to transform the first measurement signal and/or the second measurement signal to a latent space in order to determine the at least one correlation quantity. In other words, the machine-learning circuit may be configured to extract the most relevant information from the first measurement signal and/or from the second measurement signal, and to determine the at least one correlation quantity based on the information extracted. It has turned out that perturbations in any of the input signals that only occur sporadically can be identified based on a latent space representation of the measurement signals. In other words, the machine-learning circuit can identify aggressor signals even if the perturbations caused by the aggressor signal only occur sporadically.

Moreover, it has turned out that outlier samples in the measurement signals can be identified and treated appropriately based on the latent space representation of the measurement signals.

In some embodiments, the measurement instrument is established as an oscilloscope, as a signal analyzer, or as a vector network analyzer. However, it is to be understood that the measurement instrument may be established as any other type of suitable signal analysis instrument.

Embodiments of the present disclosure further provide measurement systems. In an embodiment, the measurement system comprises a device under test and a measurement instrument described above, wherein the device under test has at least two test points.

Regarding the advantages and further properties of the measurement system, reference is made to the explanations given above with respect to the measurement instrument, which also hold for the measurement system and vice versa.

According to an aspect of the present disclosure, the device under test may, for example, comprise a printed circuit board, wherein the printed circuit board comprises the at least two test points. Thus, the measurement instrument described above can be used for testing printed circuit boards with respect to aggressor signals. In other words, the measurement instrument can be used to identify electronic components, e.g., electronic circuits, influencing other electronic components, e.g., electronic circuits, printed on the printed circuit board.

Embodiments of the present disclosure further provide signal processing methods for testing a device under test. The device under test may have at least two test points. In an embodiment, the signal processing method comprises the following steps:

receiving a first input signal via a first measurement channel and a second input signal via a second measurement channel;

processing the first input signal by the first measurement channel, thereby generating a first measurement signal;

processing the second input signal by the second measurement channel, thereby generating a second measurement signal; and determining at least one correlation quantity being indicative of a correlation between the first measurement signal and the second measurement signal by a machine-learning technique.

In some embodiments, any of the measurement instruments described above and/or the measurement systems described above are/is configured to perform the signal processing methods set forth herein.

Regarding the advantages and further properties of the signal processing method, reference is made to the explanations given above with respect to the measurement instrument, which also hold for the signal processing method and vice versa.

According to an aspect of the present disclosure, the signal processing method may further comprise the following step: trying to reconstruct the second measurement signal based on the first measurement signal by the machine-learning technique in order to determine the at least one correlation quantity.

If the machine-learning circuit succeeds in reconstructing the second measurement signal (at least partially) based on the first measurement signal, this is a strong indicator for a correlation between the measurement signals, and thus between the input signals. Accordingly, in this case it can be concluded that the first input signal is an aggressor signal with respect to the second input signal.

According to another aspect of the present disclosure, the at least one correlation quantity may, for example, comprise a reconstruction function, wherein the reconstruction function describes a dependency of the second measurement signal on the first measurement signal. In other words, the machine-learning circuit tries to find a reconstruction function $s_2(x)=f(s_1(x))$ that describes the second measurement signal $s_2(x)$ in dependence of the first measurement signal $s_1(x)$, wherein x represents a time variable and/or a frequency variable. If such a function $f$ can be found, this is a strong indicator for a correlation between the measurement signals, and thus between the input signals. Accordingly, in this case it can be concluded that the first input signal is an aggressor signal with respect to the second input signal.

The reconstruction function $f$ may be a non-linear function. Accordingly, non-linear correlations between the input signals can be identified.

In some embodiments, the machine-learning circuit may try to find a (non-linear) reconstruction function $S_2(x)=f(S_{1,i}(x), S_{2,i}(x))$ that describes the second measurement signal $S_2(x)$ in dependence of an ideal first measurement signal $S_{1,i}(x)$ and in dependence of an ideal second measurement signal $S_{2,i}(x)$, i.e., based on measurement signals without any perturbation due to aggressor signals. If such a reconstruction function $f$ can be found (and the dependence on $S_{2,i}(x)$ is non-trivial) this is a strong indicator for a correlation between the measurement signals, and thus between the input signals. Accordingly, in this case it can be concluded that the first input signal is an aggressor signal with respect to the second input signal.

The ideal measurement signals $S_{1,i}(x)$ may be obtained by measuring the first input signal while the electronic component of the device under test generating the second input signal is turned off. Likewise, the ideal measurement signal $S_{2,i}(x)$ may be obtained by measuring the second input signal while the electronic component of the device under test generating the first input signal is turned off.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed. Similarly, any steps described herein may be interchangeable with other steps, or combinations of steps, in order to achieve the same or substantially similar result. Moreover, some of the method steps can be carried serially or in parallel, or in any order unless specifically expressed or understood in the context of other method steps.

Figure 1:
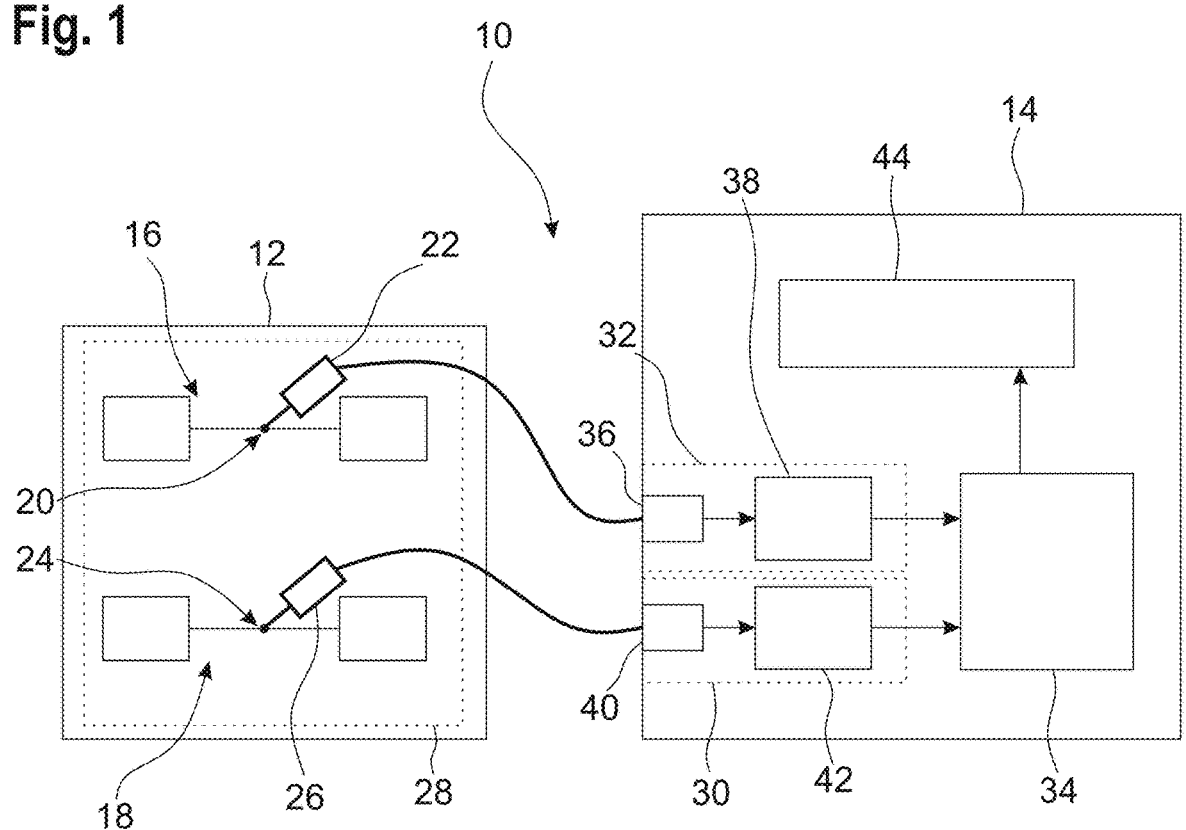
FIG. 1 schematically shows a measurement system according to an embodiment of the present disclosure.

FIG. 1 schematically shows a representative measurement system 10 comprising a device under test 12 and a measurement instrument 14. As shown in FIG. 1, the device under test 12 comprises at least two different electronic circuits that are each configured to generate and/or process electric signals. In the particular example shown in FIG. 1, the device under test comprises a first electronic circuit 16 configured to generate and/or process a first electric signal $s_1(t)$, and a second electronic circuit 18 configured to generate and/or process a second electric signal $s_2(t)$.

The first electronic circuit 16 comprises a first test point 20 via which the first electric signal $s_1(t)$ can be picked up, e.g., by a first measurement probe 22 connected to the measurement instrument 14. The second electronic circuit 18 comprises a second test point 24 via which the second electric signal $s_2(t)$ can be picked up, e.g., by a second measurement probe 26 connected to the measurement instrument 14.

In general, the device under test 12 may be established as any kind of electronic device. Optionally, the device under test 12 may comprise a printed circuit board 28, wherein the electronic circuits 16, 18 are printed on the printed circuit board 28. In some embodiments, the device under test 12 may even be established as a printed circuit board.

In general, the measurement instrument 14 may be established as an oscilloscope, as a signal analyzer, or as a vector network analyzer. However, it is to be understood that the measurement instrument 14 may be established as any other type of suitable signal analysis instrument.

In some embodiments, the measurement instrument 14 comprises a first measurement channel 30, a second measurement channel 32, and a machine-learning circuit 34. The first measurement channel 30 comprises a first signal input 36 being connected to the first measurement probe 22. The first measurement channel 30 further comprises a first signal processing circuit 38 being interconnected between the first signal input 36 and the machine-learning circuit 34.

The second measurement channel 32 comprises a second signal input 40 being connected to the second measurement probe 26. The second measurement channel 32 further comprises a second signal processing circuit 42 being interconnected between the second signal input 40 and the machine-learning circuit 34.

Electronic devices having several signal processing and/or signal generating circuits may bear the problem that the individual electronic circuits influence each other in an unwanted fashion, thereby causing perturbations in one or several of the electronic signals.

In the example of FIG. 1, the first electric signal $s_1(t)$ may influence the second electric signal $s_2(t)$ in an unwanted manner or vice versa.

Figure 2:
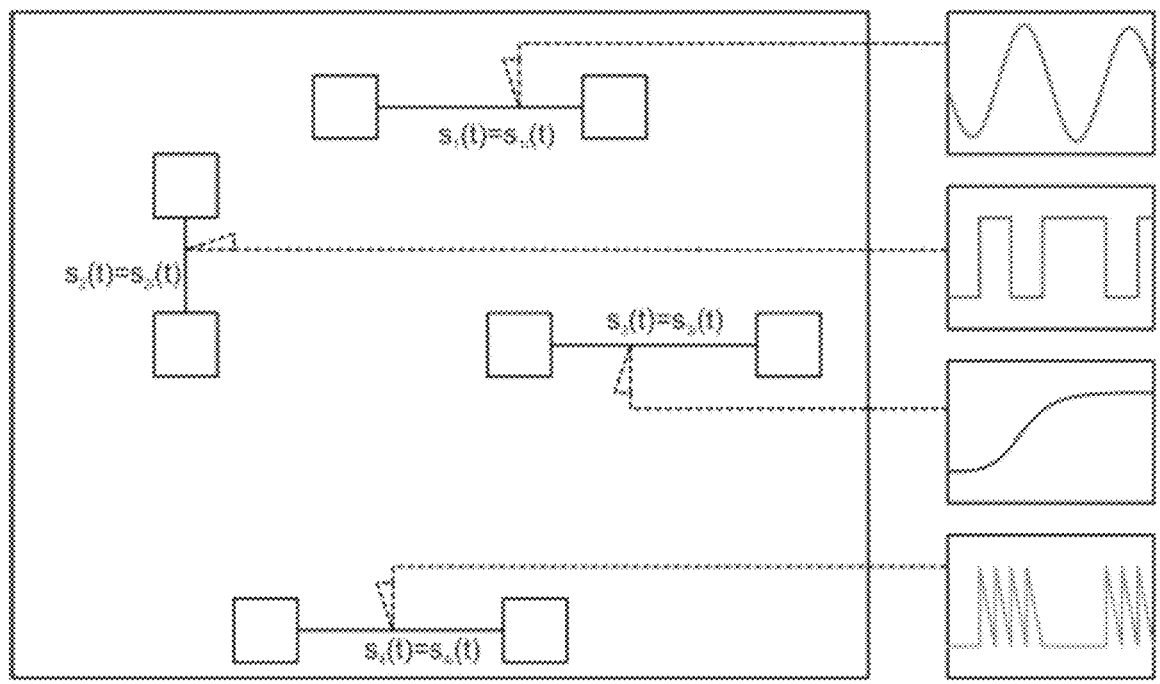
FIG. 2 shows an example of an ideal device under test with the associated measurement signals.

FIG. 2 shows an representative device under test 12 having four different electronic circuits generating/processing four electric signals $s_1(t)$, $s_2(t)$, $s_3(t)$, and $s_4(t)$. In some embodiments, the device under test 12 shown in FIG. 2 is an ideal electronic device, in the sense that there are no aggressor signals. In other words, the four electric signals $s_1(t)$, $s_2(t)$, $s_3(t)$, and $s_4(t)$ do not influence each other in an unwanted manner. Accordingly, the four electric signals are ideal electric signals $s_{1,i}(t)$, $s_{2,i}(t)$, $s_{3,i}(t)$, and $s_{4,i}(t)$.

Figure 3:
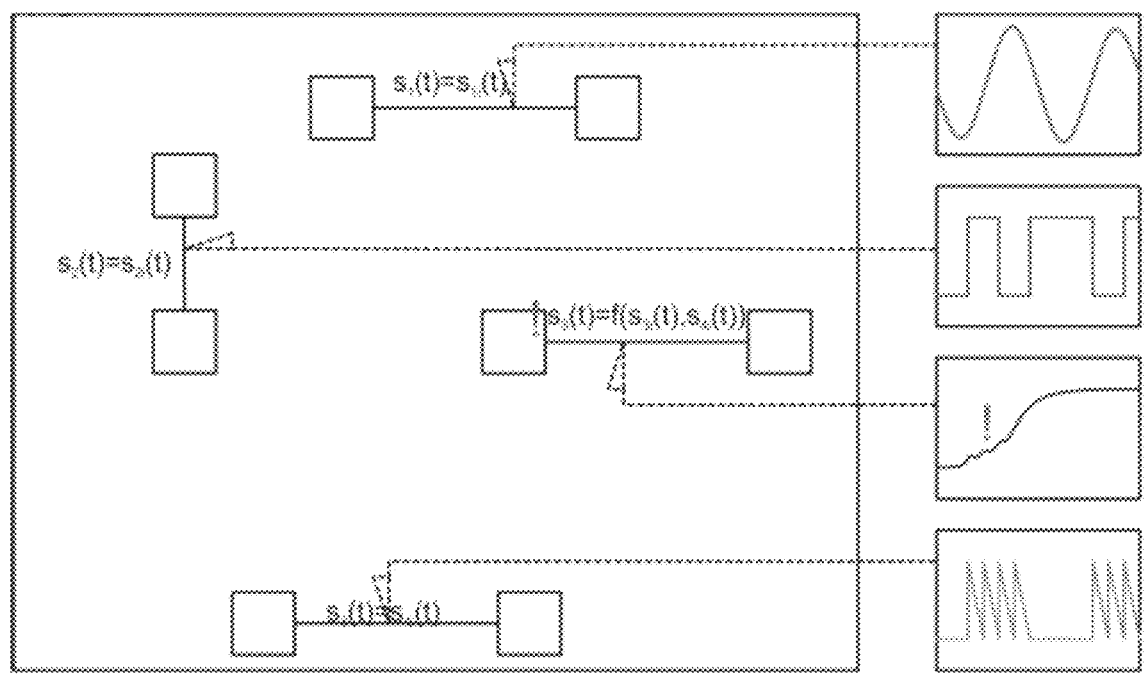
FIG. 3 shows a device under test having an aggressor signal and the associated measurement signals.

FIG. 3 shows the same device under test 12, but with a perturbation in the third electric signal $s_3(t)$ due to an unwanted perturbation from any of the other electric signals $s_1(t)$, $s_2(t)$, and $s_4(t)$.

Figure 4:
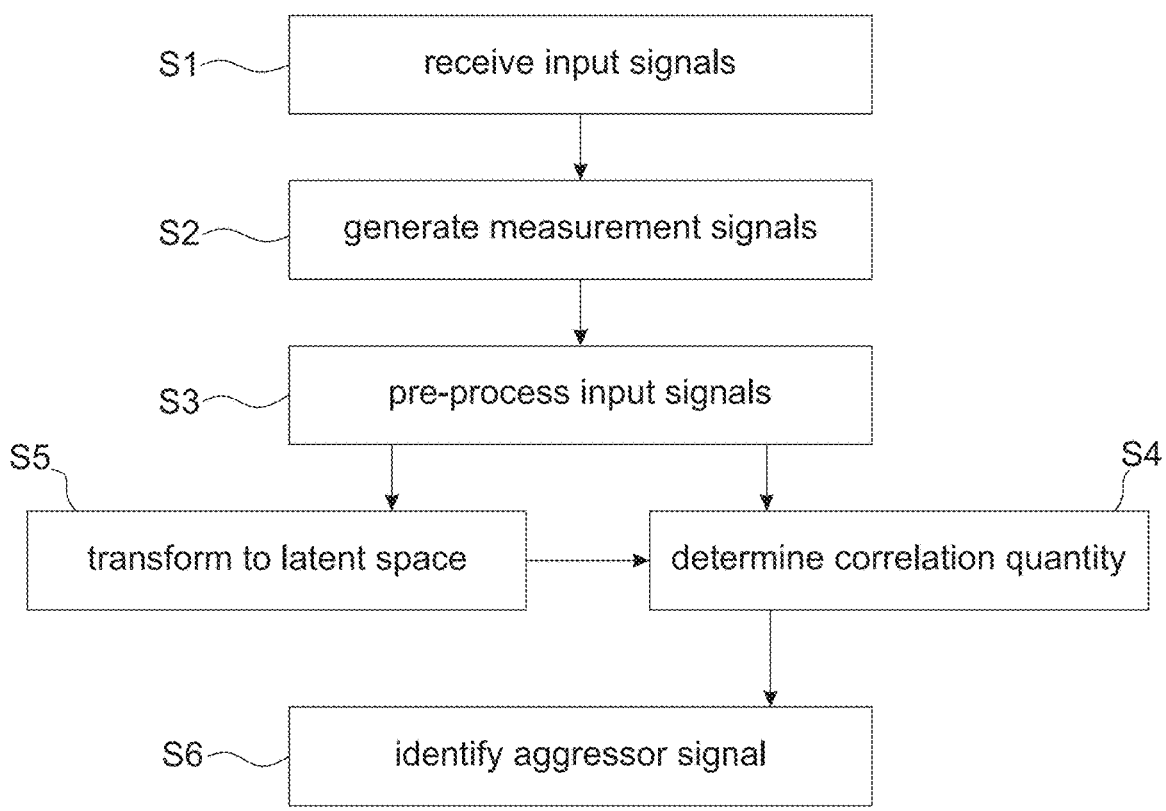
FIG. 4 shows a flow chart of a representative signal processing method according to an embodiment of the present disclosure.

The measurement instrument 14 can be used to identify the aggressor signal(s) in the device under test 12. For example, the measurement instrument 14 is configured to perform a signal processing method for testing the device under test 12. One representative embodiment of a method that can be performed is described in the following with reference to FIG. 4.

In the following, the signal processing method is described for the particular example of the device under test 12 shown in FIG. 3. However, it is to be understood that the signal processing method is also applicable to any other number of electric signals bigger than or equal to 2.

A first input signal and a second input signal received via the first measurement channel 30 and the second measurement channel 32, respectively (step S1).

Therein, the first input signal may be any one of the electric signals $s_1(t)$, $s_2(t)$, $s_3(t)$, and $s_4(t)$. The second input signal may be any other one of the electric signals $s_1(t)$, $s_2(t)$, $s_3(t)$, and $s_4(t)$.

The first input signal and the second input signal are processed by the first signal processing circuit 38 and the second signal processing circuit 42, respectively, thereby generating a first measurement signal and a second measurement signal, respectively (step S2).

The input signals are received and processed over a predetermined period of time, such that measurement data of the input signals (i.e., the measurement signals) is available over the predetermined period of time. For example, multiple recordings of each input signal may be generated.

Steps S1 and S2 may be repeated until measurement signals are generated for each of the electric signals $s_1(t)$, $s_2(t)$, $s_3(t)$, and $s_4(t)$ of the device under test 12.

Figure 5:
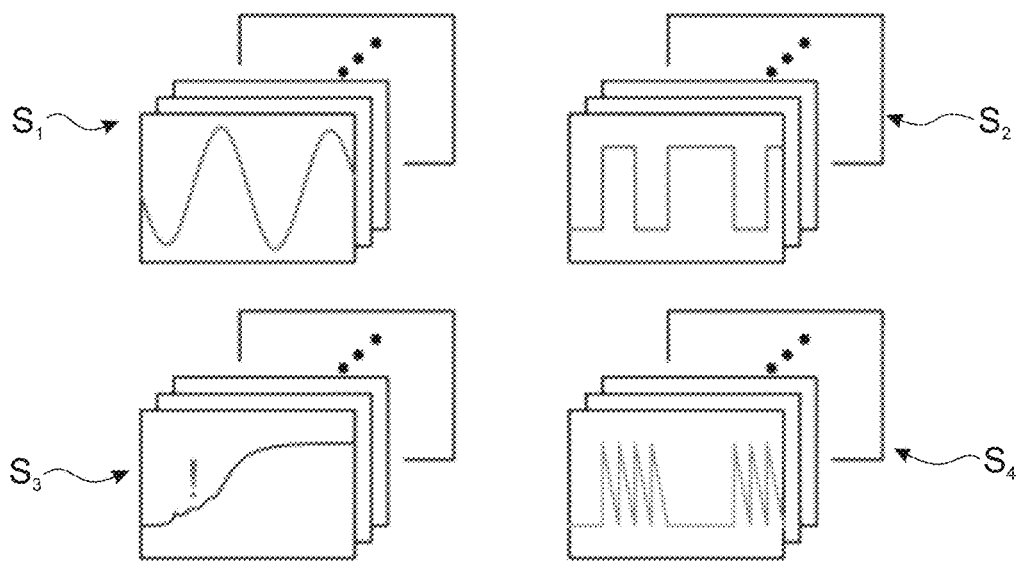
FIGS. 5 and 6 show illustrations of individual steps of the signal processing method of FIG. 4.

This is illustrated in FIG. 5, which shows four sets of measurement signal data associated with the measurement signals $S_1$, $S_2$, $S_3$, and $S_4$ that are observed over a predetermined time T. Alternatively or additionally, the measurement instrument 14 may comprise additional measurement channels, such that more input signals can be received and processed at the same time.

Optionally, the first input signal and the second input signal may be pre-processed by the first signal processing circuit 38 and the second signal processing circuit 42, respectively, such that the first measurement signal and the second measurement signal comprise statistical information regarding the first input signal and the second input signal, respectively (step S3).

The statistical information may, for example, comprise a pulse-width-histogram of any one of the input signals, a signal-to-noise ratio of any of the input signals, and/or an average power of any of the input signals.

The measurement signals are forwarded to the machine-learning circuit 34. At least one correlation quantity is determined by the machine-learning circuit 34, wherein the at least one correlation quantity is indicative of a correlation between at least one pair of measurement signals being associated with the electric signals $s_1(t)$, $s_2(t)$, $s_3(t)$, and $s_4(t)$ (step S4).

In general, the machine-learning circuit 34 is trained to determine the at least one correlation quantity based on the respective measurement signals, i.e., based on samples associated with the electric signals $s_1(t)$, $s_2(t)$, $s_3(t)$, $s_4(t)$ and, optionally, based on the additional statistical information. For example, the machine-learning circuit 34 comprises an artificial neural network, for example an autoencoder, that is trained to determine the at least one correlation quantity based on the respective measurement signals.

The at least one correlation quantity may comprise a correlation coefficient C between at least one pair of measurement signals, for example for each pair of measurement signals. For example, the correlation coefficient C may be a Pearson correlation coefficient. Accordingly, the at least one correlation quantity may comprise correlation coefficients $C(S_1(t), S_2(t))$, $C(S_1(t), S_3(t))$, $C(S_1(t), S_4(t))$, $C(S_2(t), S_3(t))$, $C(S_2(t), S_4(t))$, and/or $C(S_3(t), S_4(t))$.

Therein and in the following, signals with capital letters $S_1$, $S_2$, etc. denote the measurement signal associated with the respective electric signal with lower-case letters, i.e., $s_1$, $s_2$, etc. However, such correlation coefficients C only capture linear correlations between the respective signals.

In some embodiments, the at least one correlation quantity comprises at least one reconstruction function $f$, wherein the reconstruction function describes a dependency of one or several measurement signal on one or several other measurement signals. In other words, the machine-learning circuit 34 ties to reconstruct at least one of the measurement signals $S_1$, $S_2$, $S_3$, $S_4$ based on at least one other of the measurement signals $S_1$, $S_2$, $S_3$, $S_4$.

Figure 6:
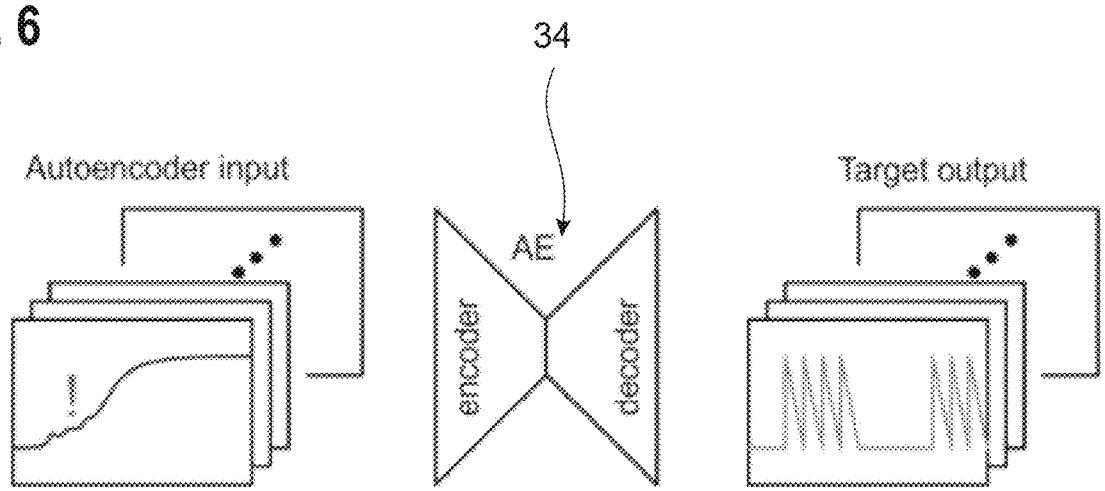

This is illustrated in FIG. 6, wherein an autoencoder of the of the machine-learning circuit 34 tries to reconstruct the measurement signal $S_4$ based on the measurement signal $S_3$. Accordingly, in this example, the measurement signal $S_3$ is an input quantity of the autoencoder, while the measurement signal $S_4$ is a target output quantity of the autoencoder.

For example, the machine-learning circuit 34 may be trained to find a (non-linear) reconstruction function $S_2(x)=f(S_{1,i}(x), S_{2,i}(x))$ that describes the second measurement signal $S_2(x)$ in dependence of an ideal first measurement signal $S_{1,i}(x)$ and in dependence of an ideal second measurement signal $S_{2,i}(x)$, i.e., based on measurement signals without any perturbation due to aggressor signals.

Therein, x represents a time variable and/or a frequency variable. Accordingly, the measurement signals may be transformed to frequency domain before trying to find the reconstruction function(s) $f$.

If such a function $f$ can be found, this is a strong indicator for a correlation between the respective measurement signals, and thus between input signals associated with the measurement signals. Accordingly, in this case it can be concluded that the first input signal is an aggressor signal with respect to the second input signal.

The reconstruction function $f$ may be a non-linear function. Accordingly, non-linear correlations between measurement signals (and thus between the input signals) can be identified.

The ideal measurement signals $S_{1,i}(x)$ may be obtained by measuring the first input signal (or rather the first electric signal $s_1(t)$) while the electronic component of the device under test 12 generating the second input signal (or rather the second electric signal $s_2(t)$) is turned off. Likewise, the ideal measurement signal $S_{2,i}(x)$ may be obtained by measuring the second input signal (or rather the second electric signal $s_2(t)$) while the electronic component of the device under test 12 generating the first input signal (or rather the first electric signal $s_1(t)$) is turned off.

In some embodiments, the machine-learning circuit 34 may try to determine a respective reconstruction function $f$ for all possible pairs of measurement signals, such that a separate reconstruction function $f$ is obtained for all possible pairs of measurement signals. This way, the influence of each input signal on all other input signals is checked.

It is noted that the reconstruction functions $f$ for different pairs of measurement signals may, of course, be different from each other. Thus, a reconstruction function $f_{12}(S_{1,i}(x), S_{2,i}(x))$ may be different from a reconstruction function $f_{13}(S_{1,i}(x), S_{3,i}(x))$. However, for better legibility the indices of $f$ are dropped above and in the following.

Optionally, the machine-learning circuit 34 may try to determine the at least one correlation quantity for groups of measurement signals, such that the at least one correlation quantity is indicative of a correlation between different groups of input signals. For example, the machine-learning circuit 34 may try to determine a reconstruction function $f(S_{1,i}(x), S_{2,i}(x); S_{3,i}(x), S_{4,i}(x))$ describing a dependence of $S_1$ and $S_2$ on $S_3$ and $S_4$.

Optionally, the measurement signals may be transformed to a latent space by the machine-learning circuit in order to determine the at least one correlation quantity (step S5).

In other words, the machine-learning circuit 34 may be configured to extract the most relevant information from the measurement signals, and to determine the at least one correlation quantity based on the information extracted.

It has turned out that perturbations in any of the input signals $s_1(t), s_2(t), s_3(t), s_4(t)$ that only occur sporadically can be identified based on a latent space representation of the associated measurement signals. In other words, the machine-learning circuit 34 can identify aggressor signals even if the perturbations caused by the aggressor signal only occur sporadically. Moreover, it has turned out that outlier samples in the measurement signals can be identified and treated appropriately based on the latent space representation of the measurement signals.

At least one aggressor signal may be automatically identified based on the at least one correlation quantity (step S6).

As already stated above, if a reconstruction function $f$ can be found that describes the interdependency of the measurement signals with a sufficient precision, this is a strong indicator for a correlation between the respective measurement signals, and thus between the input signals associated with the measurement signals.

Alternatively or additionally, the at least one correlation quantity may be displayed to a user by a display 44 of the measurement instrument 14, such that the user of the measurement instrument 14 may decide whether one of the input signals is an aggressor signal based on the at least one correlation quantity determined.

Even if the final conclusion about the aggressor signal is not performed by the machine-learning circuit 34, the at least one determined correlation quantity is easier to handle for the user than a bulk of data comprising a long-term observation of the input signals. Accordingly, the measurement instrument 14 described above is easier to handle for a user.

Moreover, the at least one correlation quantity is determined fully automatically, such that the needed time for identifying aggressor signals is significantly reduced.

Certain embodiments disclosed herein utilize circuitry (e.g., one or more circuits) in order to implement standards, protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph. It will be further appreciated that the terms "circuitry," "circuit," "one or more circuits," etc., can be used synonymously herein.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof.

In an embodiment, circuitry includes hardware circuit implementations (e.g., implementations in analog circuitry, implementations in digital circuitry, and the like, and combinations thereof). In an embodiment, circuitry includes combinations of hardware circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes one or more processors, such as, for example, microprocessors, or portions thereof and accompanying software, firmware, hardware, and the like.

In some examples, the functionality described herein can be implemented by special purpose hardware-based computer systems or circuits, etc., or combinations of special purpose hardware and computer instructions. Each of these special purpose hardware-based computer systems or circuits, etc., or combinations of special purpose hardware circuits and computer instructions form specifically configured circuits, devices, etc., capable of implemented the functionality described herein.

Various embodiments of the present disclosure or the functionality thereof may be implemented in various ways, including as non-transitory computer program products. A computer program product may include a non-transitory computer-readable storage medium storing applications, programs, program modules, scripts, source code, program code, object code, byte code, compiled code, interpreted code, machine code, executable instructions, and/or the like (also referred to herein as executable instructions, instructions for execution, program code, computer program instructions, and/or similar terms used herein interchangeably). Such non-transitory computer-readable storage media include all computer-readable media (including volatile and non-volatile media).

Embodiments of the present disclosure may also take the form of an apparatus, system, computing device, computing entity, and/or the like executing instructions stored on computer-readable storage media to perform certain steps or operations. The computer-readable media include cooperating or interconnected computer-readable media, which exist exclusively on a processing or processor system or distributed among multiple interconnected processing or processor systems that may be local to, or remote from, the processing or processor system. However, embodiments of the present disclosure may also take the form of an entirely hardware embodiment performing certain steps or operations.

Various embodiments are described above with reference to block diagrams and/or flowchart illustrations of apparatuses, methods, systems, and/or computer program instructions or program products. It should be understood that each block of any of the block diagrams and/or flowchart illustrations, respectively, of portions thereof, may be implemented in part by computer program instructions, e.g., as logical steps or operations executing on one or more computing devices. These computer program instructions may be loaded onto one or more computer or computing devices, such as special purpose computer(s) or computing device(s) or other programmable data processing apparatus(es) to produce a specifically-configured machine, such that the instructions which execute on one or more computer or computing devices or other programmable data processing apparatus implement the functions specified in the flowchart block or blocks and/or carry out the methods described herein.

These computer program instructions may also be stored in one or more computer-readable memory or portions thereof, such as the computer-readable storage media described above, that can direct one or more computers or computing devices or other programmable data processing apparatus(es) to function in a particular manner, such that the instructions stored in the computer-readable memory produce an article of manufacture including computer-readable instructions for implementing the functionality specified in the flowchart block or blocks.

It will be appreciated that the term computer or computing device can include, for example, any computing device or processing structure, including but not limited to a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof.

Accordingly, blocks of the block diagrams and/or flowchart illustrations support various combinations for performing the specified functions, combinations of operations for performing the specified functions and program instructions for performing the specified functions. Again, it should also be understood that each block of the block diagrams and flowchart illustrations, and combinations of blocks in the block diagrams and/or flowchart illustrations, or portions thereof, could be implemented by special purpose hardware-based computer systems or circuits, etc., that perform the specified functions or operations, or combinations of special purpose hardware and computer instructions.

Of course, in some embodiments, two or more of these components, or parts thereof, can be integrated or share hardware and/or software, circuitry, etc. In some embodiments, these components, or parts thereof, may be grouped in a single location or distributed over a wide area. In circumstances where the components are distributed, the components are accessible to each other via communication links.

In the foregoing description, specific details are set forth to provide a thorough understanding of representative embodiments of the present disclosure. It will be apparent to one skilled in the art, however, that the embodiments disclosed herein may be practiced without embodying all of the specific details. In some instances, well-known process steps have not been described in detail in order not to unnecessarily obscure various aspects of the present disclosure. Further, it will be appreciated that embodiments of the present disclosure may employ any combination of features described herein.

Throughout this specification, terms of art may be used. These terms are to take on their ordinary meaning in the art from which they come, unless specifically defined herein or the context of their use would clearly suggest otherwise.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A measurement instrument for testing a device under test, wherein the device under test has at least two test points, the measurement instrument comprising:
a first measurement channel configured to process a first input signal associated with one of the at least two test points, thereby generating a first measurement signal;
a second measurement channel configured to process a second input signal associated with another one of the at least two test points, thereby generating a second measurement signal; and
a machine-learning circuit configured to determine at least one correlation quantity based on the first measurement signal and based on the second measurement signal,
wherein the at least one correlation quantity is indicative of a correlation between the first measurement signal and the second measurement signal, and
wherein the machine-learning circuit is configured to determine, based on the at least one correlation quantity, whether the first input signal is an aggressor signal with respect to the second input signal within the device under test, or whether the second input signal is an aggressor signal with respect to the first input signal within the device under test,
wherein the at least one correlation quantity comprises a reconstruction function,
wherein the machine-learning circuit is trained to determine the reconstruction function $S_2(x)=f(S_{1,i}(x), S_{2,i}(x))$ that describes the second measurement signal $S_2(x)$ in dependence of an ideal first measurement signal $S_{1,i}(x)$ and in dependence of an ideal second measurement signal $S_{2,i}(x)$ or a reconstruction function $S_1(x)=f(S_{1,i}(x), S_{2,i}(x))$ that describes the first measurement signal $S_1(x)$ in dependence of the ideal first measurement signal $S_{1,i}(x)$ and in dependence of the ideal second measurement signal $S_{2,i}(x)$, wherein x is a time variable and/or a frequency variable,
wherein the first ideal measurement signal $S_{1,i}(x)$ is the first measurement signal with an electronic component of the device under test generating the second input signal being turned off, and wherein the second ideal measurement signal $S_{2,i}(x)$ is the second measurement signal with an electronic component of the device under test generating the first input signal being turned off.

2. The measurement instrument of claim 1, wherein the machine-learning circuit comprises an artificial neural network.

3. The measurement instrument according to claim 2, wherein the artificial neural network comprises an autoencoder.

4. The measurement instrument according to claim 1, wherein the first measurement channel is configured to pre-process the first input signal such that the first measurement signal comprises statistical information regarding the first input signal, and/or wherein the second measurement channel is configured to pre-process the second input signal such that the second measurement signal comprises statistical information regarding the second input signal.

5. The measurement instrument according to claim 4, wherein the machine-learning circuit is configured to determine the at least one correlation quantity based on the statistical information.

6. The measurement instrument according to claim 1, wherein the measurement instrument is configured to process at least one further input signal, thereby generating at least one further measurement signal, wherein the machine-learning circuit is configured to determine the at least one correlation quantity based on the at least one further measurement signal, and wherein the at least one correlation quantity is indicative of a correlation between the at least one further measurement signal and at least one of the first measurement signal and the second measurement signal.

7. The measurement instrument according to claim 1, wherein the machine-learning circuit is configured to transform the first measurement signal and/or the second measurement signal to a latent space in order to determine the at least one correlation quantity.

8. The measurement instrument according to claim 1, wherein the measurement instrument is established as an oscilloscope, as a signal analyzer, or as a vector network analyzer.

9. A measurement system, comprising a device under test and a measurement instrument according to claim 1, wherein the device under test has at least two test points.

10. The measurement system of claim 9, wherein the device under test comprises a printed circuit board, wherein the printed circuit board comprises the at least two test points.

11. A signal processing method for testing a device under test, wherein the device under test has at least two test points, the signal processing method comprising the following steps:
receiving a first input signal via a first measurement channel and a second input signal via a second measurement channel;
processing the first input signal by the first measurement channel, thereby generating a first measurement signal;
processing the second input signal by the second measurement channel, thereby generating a second measurement signal;
determining, by a machine-learning circuit, at least one correlation quantity being indicative of a correlation between the first measurement signal and the second measurement signal by means of a machine-learning technique; and
determining, by the machine-learning circuit, based on the at least one correlation quantity, whether the first input signal is an aggressor signal with respect to the second input signal within the device under, and/or whether the second input signal is an aggressor signal with respect to the first input signal within the device under test,
wherein the at least one correlation quantity comprises a reconstruction function,
wherein the machine-learning circuit is trained to determine the reconstruction function $S_2(x)=f(S_{1,i}(x), S_{2,i}(x))$ that describes the second measurement signal $S_2(x)$ in dependence of an ideal first measurement signal $S_{1,i}(x)$ and in dependence of an ideal second measurement signal $S_{2,i}(x)$ or a reconstruction function $S_1(x)=f(S_{1,i}(x), S_{2,i}(x))$ that describes the first measurement signal $S_1(x)$ in dependence of the ideal first measurement signal $S_{1,i}(x)$ and in dependence of the ideal second measurement signal $S_{2,i}(x)$, wherein x is a time variable and/or a frequency variable,
wherein the first ideal measurement signal $S_{1,i}(x)$ is the first measurement signal with an electronic component of the device under test generating the second input signal being turned off, and wherein the second ideal measurement signal $S_{2,i}(x)$ is the second measurement signal with an electronic component of the device under test generating the first input signal being turned off.

* * * * *